(12) United States Patent
Nakamura et al.

(10) Patent No.: US 9,124,270 B2
(45) Date of Patent: Sep. 1, 2015

(54) ELECTRIC POWER CONVERSION DEVICE AND SURGE VOLTAGE SUPPRESSING METHOD

(75) Inventors: Kazuya Nakamura, Chiyoda-ku (JP); Kei Terada, Chiyoda-ku (JP); Kazutaka Takahashi, Chiyoda-ku (JP); Shigeo Jimbo, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 379 days.

(21) Appl. No.: 13/637,285

(22) PCT Filed: Mar. 31, 2010

(86) PCT No.: PCT/JP2010/055880
§ 371 (c)(1),
(2), (4) Date: Sep. 25, 2012

(87) PCT Pub. No.: WO2011/121765
PCT Pub. Date: Oct. 6, 2011

(65) Prior Publication Data
US 2013/0016542 A1 Jan. 17, 2013

(51) Int. Cl.
*H02M 7/537* (2006.01)
*H03K 17/16* (2006.01)
*H02M 7/5387* (2007.01)

(52) U.S. Cl.
CPC ........... *H03K 17/163* (2013.01); *H02M 7/5387* (2013.01); *Y02B 70/1483* (2013.01)

(58) Field of Classification Search
CPC ........... H02M 1/32; H02M 1/34; H02M 1/38; H02M 1/40; H02M 7/537; H02M 7/5387; H02M 7/53806; H02M 7/53871; H02M 3/33507
USPC ................ 363/56.01–56.12, 95, 98, 131, 132
See application file for complete search history.

(56) References Cited

U.S. PATENT DOCUMENTS

| 5,200,878 A | 4/1993 | Sasagawa et al. |
| 2004/0079989 A1* | 4/2004 | Kaneko et al. ................. 257/328 |

(Continued)

FOREIGN PATENT DOCUMENTS

| JP | 04-079758 A | 3/1992 |
| JP | 2000-092817 A | 3/2000 |

(Continued)

OTHER PUBLICATIONS

Chinese Office Action, issued Jun. 4, 2014, Application No. 2010-80066009.2.

(Continued)

*Primary Examiner* — Adolf Berhane
*Assistant Examiner* — Yemane Mehari
(74) *Attorney, Agent, or Firm* — Sughrue Mion, PLLC; Richard C. Turner (57) ABSTRACT

To provide an electric power conversion device that converts direct current power supplied from a direct-current power supply into alternating current power, the electric power conversion device includes six switching elements constituted by a voltage-driven transistor that uses a wide bandgap semiconductor and a diode, and a drive circuit that controls a voltage for driving the transistor at a time of turning off the switching elements based on a predetermined voltage profile specifying that the transistor is operated in a non-linear region.

12 Claims, 9 Drawing Sheets

(56) References Cited

U.S. PATENT DOCUMENTS

| | | |
|---|---|---|
| 2004/0252435 A1 | 12/2004 | Ishikawa et al. |
| 2007/0030615 A1 | 2/2007 | Ishikawa et al. |
| 2008/0043500 A1 | 2/2008 | Asano et al. |
| 2010/0172162 A1* | 7/2010 | Tallam et al. .................. 363/37 |
| 2010/0328975 A1* | 12/2010 | Hibino et al. ................. 363/126 |

FOREIGN PATENT DOCUMENTS

| | | |
|---|---|---|
| JP | 2001-169413 A | 6/2001 |
| JP | 2002-095238 A | 3/2002 |
| JP | 2004-336845 A | 11/2004 |
| JP | 2005-006381 A | 1/2005 |
| JP | 2009-021395 A | 1/2009 |
| JP | 2009-055200 A | 3/2009 |
| JP | 2009-219268 A | 9/2009 |
| WO | 2006/003936 A1 | 1/2006 |
| WO | WO 2009113298 A1 * | 9/2009 .............. H02M 7/48 |

OTHER PUBLICATIONS

International Search Report of PCT/JP2010/055880 dated Jul. 6, 2010.
Korean Office Action (Notice of Preliminary Rejection) dated Mar. 11, 2014, Patent Application No. 10-2012-7024251.
Taiwanese Office Action, Oct. 1, 2013, Application No. 99121633.
Japanese Office Action, Aug. 20, 2013, Patent Application No. 2012-507985.

* cited by examiner

ELECTRIC POWER CONVERSION DEVICE AND SURGE VOLTAGE SUPPRESSING METHOD

CROSS REFERENCE TO RELATED APPLICATIONS

This application is a National Stage of International Application No. PCT/JP2010/055880filed Mar. 31, 2010, the contents of all of which are incorporated herein by reference in their entirety.

FIELD

The present invention relates to an electric power conversion device and a surge voltage suppressing method.

BACKGROUND

In a switching element such as a servo circuit or an inverter circuit, when flow of a current is forcibly turned off, a steep forward voltage is applied. Therefore, in the switching element, because power loss at the time of turning it off is large and the power loss is concentrated on a local area, the switching element itself may be broken. Particularly, when a wire for feeding a DC (Direct Current) to the switching element is long, inductive reactance of the wire becomes large, and thus the surge voltage at the time of turning off the switching element becomes higher.

Generally, the switching element is protected from the surge voltage by using a snubber circuit such as a snubber capacitor. The snubber capacitor is connected to the switching element in parallel. When the switching element is turned off, the surge voltage described above is suppressed by charging a current from the switching element into the snubber capacitor. In addition, there is a case where voltage oscillation is suppressed by connecting a resistor to the snubber capacitor in series.

As a conventional technique of protecting an element from a surge voltage without using a snubber capacitor, for example, Patent Literature 1 mentioned below discloses a technique of preventing breakage of an element due to an overcurrent (a surge current), when the overcurrent exceeding a rated value flows, by increasing a gate voltage.

Patent Literature 2 mentioned below discloses a technique of increasing an on-resistance to take over the resistance of a snubber circuit, while setting a diode used for the snubber circuit as a wide bandgap type (SiC) and operating the diode with a current density, which is 20 to 30 times denser than a current density at the time of a normal temperature operation.

CITATION LIST

Patent Literatures

Patent Literature 1: Japanese Patent Application Laid-open No. 2009-55200
Patent Literature 2: International Publication No. WO2006/003936

SUMMARY

Technical Problem

However, in the above technique of suppressing a surge voltage by using a snubber capacitor, when the technique is applied to a large-capacity inverter, it is necessary to connect the snubber capacitor to each transistor, and the snubber capacitor is required to be a capacitor with a large capacity. Therefore, there is a problem that the size of the circuit of the large-capacity inverter becomes large and the circuit becomes complex. Particularly, if it is attempted to handle a short-circuit current when output short-circuit occurs in the inverter, the size of the snubber capacitor becomes considerably large.

Furthermore, according to the technique of Patent Literature 1 described above, breakage of an element due to an overcurrent is prevented by increasing a gate voltage. Therefore, there is a problem in this technique that at the time of turning off the element (when the gate voltage is dropped), the surge voltage cannot be reduced.

Further, the technique of Patent Literature 2 described above is a technique in which the resistance of a snubber circuit is taken over by a diode. Therefore, there is a problem in this technique that there is no mention of a countermeasure for a snubber capacitor becoming a capacitor with a large capacity.

The present invention has been achieved in view of the above problems, and an object of the present invention is to provide an electric power conversion device and a surge voltage suppressing method that can suppress a surge voltage by using a small and simple circuit.

Solution to Problem

In order to solve the above problem and in order to attain the above object, an electric power conversion device of the present invention, includes: a voltage-driven wide bandgap switching element that uses a wide bandgap semiconductor; and a drive circuit that controls a voltage for driving the wide bandgap switching element at a time of turning off the wide bandgap switching element based on a voltage profile specifying that the wide bandgap switching element is operated in a non-linear region.

Advantageous Effects of Invention

According to the electric power conversion device and the surge voltage suppressing method of the present invention, it is possible to suppress a surge voltage by using a small and simple circuit.

DESCRIPTION OF EMBODIMENTS

Exemplary embodiments of an electric power conversion device and a surge voltage suppressing method according to the present invention will be explained below in detail with reference to the accompanying drawings. The present invention is not limited to the embodiments.

First Embodiment

Figure 1:
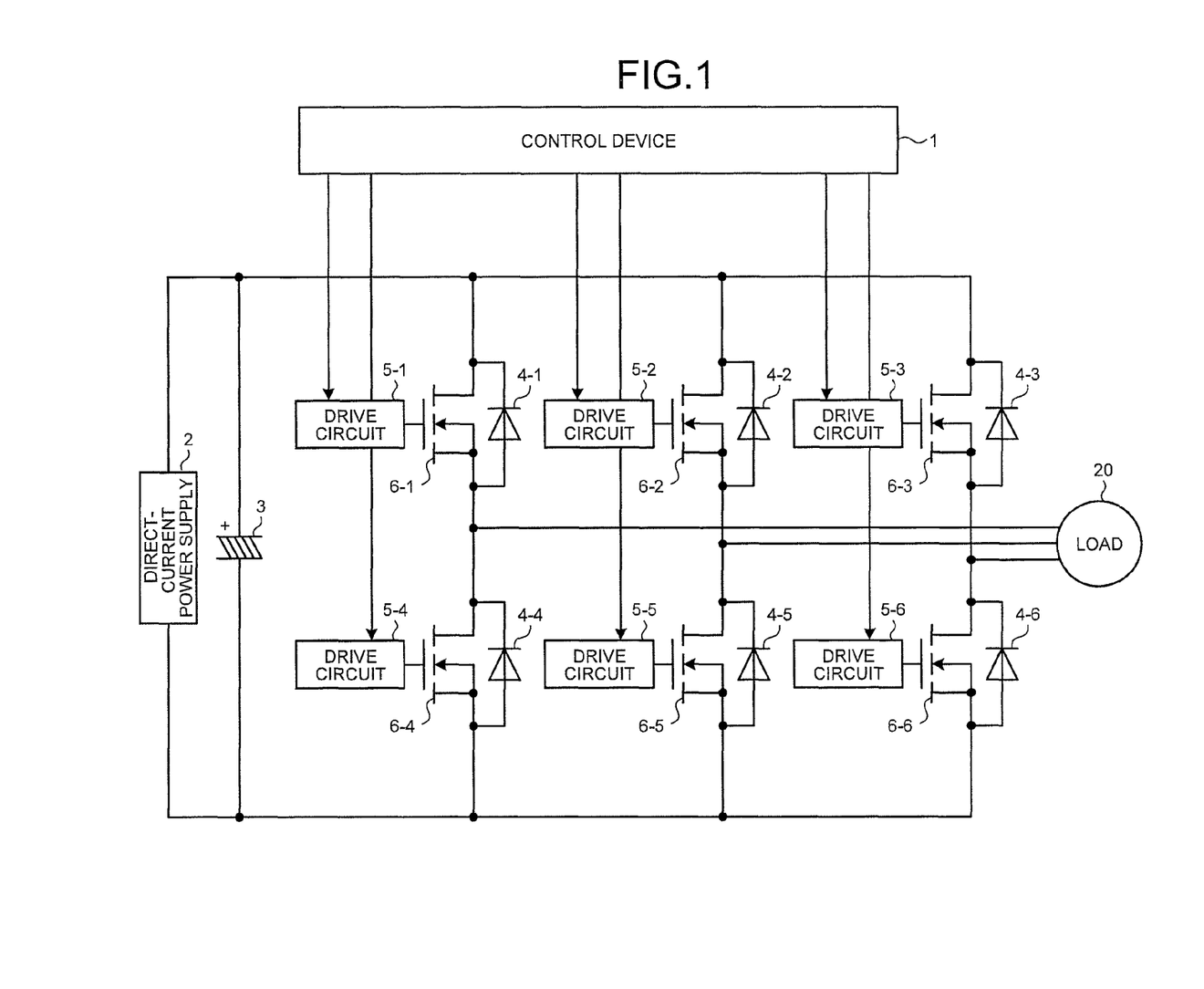
FIG. 1 is a configuration example of an electric power conversion device according to a first embodiment.

FIG. 1 is a configuration example of an electric power conversion device according to a first embodiment of the present invention. The electric power conversion device according to the present embodiment is an inverter device including a smoothing capacitor 3 and an inverter circuit. This inverter circuit is controlled by a control device 1, and converts a direct current input from a direct-current power supply 2 into a three-phase alternating current and then supplies the current to a load 20 such as a motor. The direct-current power supply 2 can be constituted by a converter circuit that rectifies an alternating-current power supply such as a commercial alternating-current power supply.

The smoothing capacitor 3 is a capacitor that smoothes a voltage of the direct-current power supply 2. For example, an electrolytic capacitor can be adopted as the smoothing capacitor 3. The inverter circuit is constituted by six voltage-driven switching elements and drive circuits 5-1 to 5-6 that drive the switching elements. These switching elements are switching elements using a wide bandgap semiconductor, and as an example, a SiC (Silicon Carbide) MOSFET (Metal Oxide Semiconductor Field Effect Transistor) is used in the present embodiment. Note that these switching elements are not limited to those using a SiC MOSFET, and other types of wide bandgap semiconductor such as a GaN (Gallium nitride) MOSFET or a diamond MOSFET can be also used.

Conventionally, the operation temperature of a Si (Silicon) semiconductor generally used as a switching element is 150° C. at maximum; however, the maximum value of the operation temperature of a wide bandgap semiconductor is higher than that of the Si semiconductor. Therefore, the maximum value of the operation temperature of switching elements using a wide bandgap semiconductor such as those in the present embodiment becomes equal to or higher than 150° C. Accordingly, the switching elements according to the present embodiment have an upper limit of the operable temperature that is higher than that of conventional switching elements, and thus these elements are suitable for operations under a high temperature environment.

Specifically, each of the switching elements includes a diode 4-$i$ ($i$=1, 2, ... 6) and a transistor (SiC MOSFET) 6-$i$. The drive circuit 5-$i$ controls a gate potential of the transistor 6-$i$ based on an instruction from the control device 1, and switches on and off of the switching element to which the transistor 6-$i$ itself is connected.

At the time of turning off each of the switching elements (a time until which an on-state is shifted to an off-state), a surge voltage is applied on the switching elements. Therefore, because the power loss at the time of turning off the switching elements is large and the power loss is concentrated on a local area, the switching elements themselves may be broken. Generally, in a conventional inverter circuit using switching elements of a Si semiconductor, a surge voltage of the circuit is suppressed by a snubber capacitor. Particularly, when the conventional inverter circuit includes a long direct-current power supply circuit such as a bus bar, the surge voltage becomes higher, and the snubber capacitor is required to have a large capacity. In the present embodiment, in order to achieve downsizing and simplification of a circuit, the surge voltage is suppressed by controlling a gate voltage at the time of turning off the switching elements so as to operate the switching elements in a non-linear region, while not using any large-capacity snubber capacitor.

Figure 2:
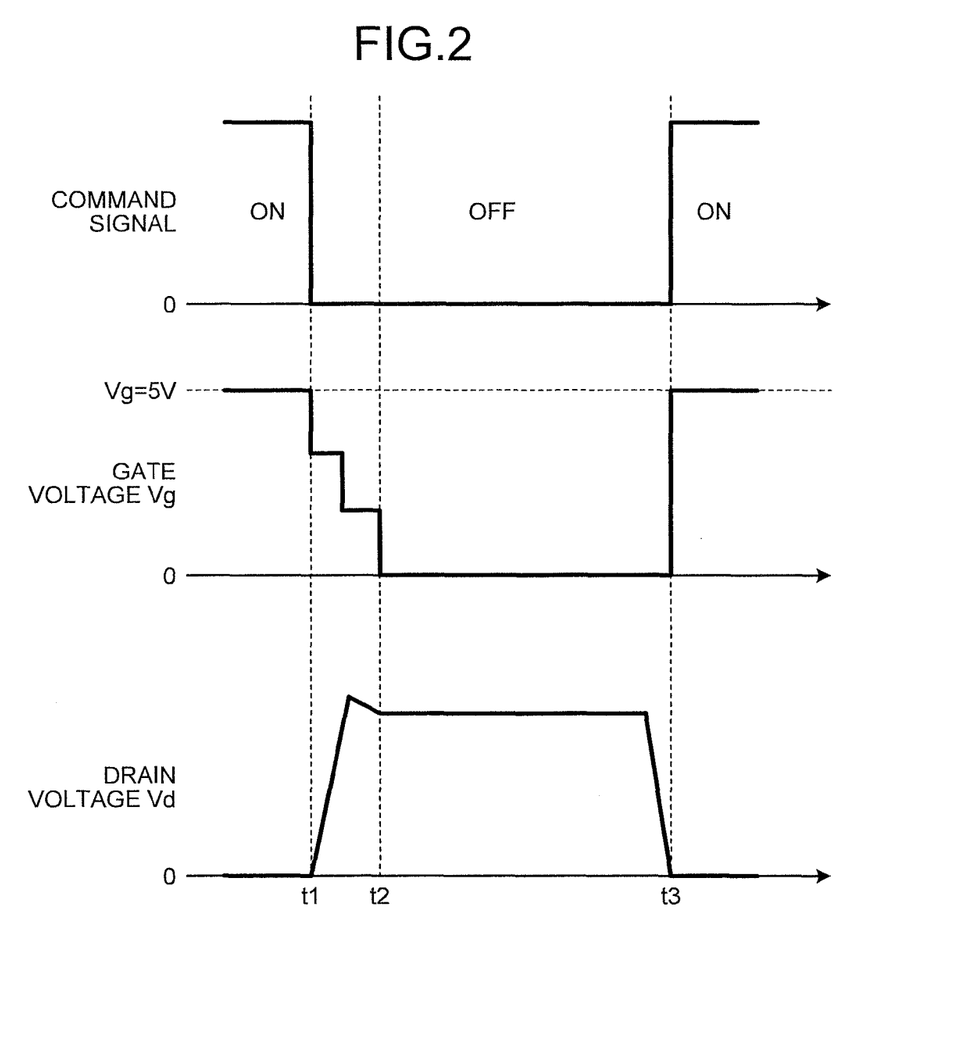
FIG. 2 is a timing chart of an example of a surge voltage suppressing method according to the first embodiment.

FIG. 2 is a timing chart of an example of a surge voltage suppressing method according to the present embodiment. The top part of FIG. 2 represents a command signal to be supplied from the control device 1 to the drive circuit 5-$i$ for holding an on-state or off-state of a switching element. The control device 1 transmits the command signal to each of the drive circuits 5-1 to 5-6, thereby controlling the on-state or off-state of the respective switching elements.

The middle part of FIG. 2 represents a gate voltage Vg of a switching element. The drive circuit 5-$i$ controls the gate voltage Vg of the transistor 6-$i$ as shown in FIG. 2, based on a command signal from the control device 1. In FIG. 2, an example in which a gate voltage in an on-state is 5 volts is shown. An inversion layer is formed by the gate voltage Vg of 5 volts, conduction between a source and a drain is made, a drain current Id flows, and the switching element becomes an on-state. In the ON-state, a drain voltage Vd is maintained to be 0 volt. The gate voltage in the on-state does not need to be 5 volts, and any value can be applied as long as setting an appropriate value such as 2.5 volts or 3.3 volts according to the transistor to be used. In addition, the bottom part of FIG. 2 represents the drain voltage Vd.

As shown in the top part of FIG. 2, the command signal changes from ON to OFF at a time t1. Along with this change, as shown in the middle part of FIG. 2, the drive circuit 5-$i$ causes the gate voltage Vg to drop in a stepwise manner from the time t1.

Figure 3:
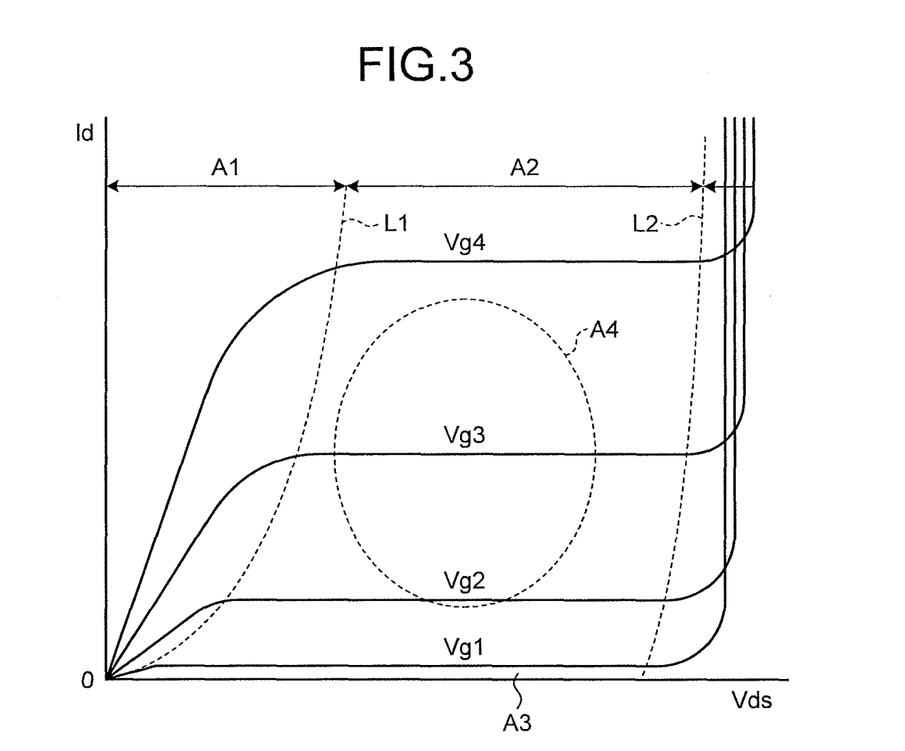
FIG. 3 is an example of a relationship between a drain/source voltage and a drain current of a switching element.

FIG. 3 is an example of a relationship between a drain/source voltage (drain voltage: Vd) and the drain current (Id) of a switching element. Relationships between Vd and Id with respect to the gate voltage Vg (=Vg1, Vg2, Vg3, Vg4) are represented by four curved lines. A linear region A1 (the region on the left side of a curved line L1) is a linear region (an unsaturated region) where the drain current (Id) changes substantially linearly with respect to the drain/source voltage (drain voltage: Vd). A non-linear region A2 (the region surrounded by the curved line L1, a curved line L2, and a curved line of Vg1) is a non-linear region (a saturated region) where the drain current Id changes non-linearly with respect to the drain voltage Vd. In addition, a blocked region A3 (the lower side of the curve of Vg1) is a blocked region where the drain current Id does not flow.

In a conventional general electric power conversion device, when a command signal changes from ON to OFF, the gate voltage Vg changes from 5 volts to 0 volt at once. As the gate voltage becomes 0 volt, a drain current is reduced, and then a drain voltage is applied, thereby causing the electric power conversion device to be in an off-state where conduction between a source and a drain is not made. Thereafter, the electric power conversion device is operated in the blocked region A3 during the time when the gate voltage is 0 volt, and thus an off-state is kept until the gate voltage Vg of 5 volts is applied again. In the conventional general electric power conversion device, its drain voltage is 0 volt when it is in an on-state, and this means that the linear region Al and the blocked region A3 are used at the time of turning off the device. Meanwhile, when the gate voltage becomes 0 volt, although switching elements in the electric power conversion device are in an off-state, a surge voltage is generated in the switching elements due to an energy accumulated within a circuit, and the drain voltage suddenly rises.

To suppress such a surge voltage, in the present embodiment, when the command signal changes from ON to OFF, the gate voltage Vg is gradually reduced so that the switching elements are operated in a surge-suppression-time usage region A4 in the non-linear region A2. In the example of FIG. 2, the gate voltage Vg is dropped at three stages (such as 3.3 volts, 1.7 volts, and 0 volt). That is, the gate voltage Vg is first dropped from 5 volts to that of between 0 to 5 volts. As a result of an increase of a drain voltage along with the drop of the gate voltage Vg, the gate voltage is kept until when the switching elements are operated in the surge-suppression-time usage region A4. Thereafter, similarly, an operation of dropping the gate voltage in the surge-suppression-time usage region A4 is repeated, and the gate voltage Vg is ultimately set to be 0 volt.

The non-linear region A2 can be ascertained in advance based on the specifications or the like of the switching elements. As for a profile of a gate voltage at the time of operating the switching elements in the non-linear region A2 (as to what sort of speed the gate voltage should be dropped), for example, it suffices that the profile is obtained in advance by tests or analyses. Specifically, for example, profiles of a plurality of gate voltages are prepared in advance. Subsequently, whether the switching elements can be operated in the non-linear region A2 when one of the profiles is used is examined by analyses or tests, in the order from that among these profiles that drops the gate voltage most suddenly (in the order of the dropping speed), and a profile by which the switching elements are operable in the non-linear region A2 and having the highest dropping speed is adopted. When the gate voltage is dropped, it is desirable that the gate voltage is dropped from 5 volts to 0 volt within a time that is substantially equal to a carrier frequency of the switching elements (such as approximately 10 to 400 microseconds).

The surge-suppression-time usage region A4 is only an example, and the region used for turning off the switching elements while suppressing a surge current is not limited to the surge-suppression-time usage region A4, and can be any region as long as it is in the non-linear region A2.

While it suffices for the transistors 6-1 to 6-6 to use a wide bandgap semiconductor as described above, unipolar switching elements are more preferable than bipolar switching elements for simplification of a circuit, because control of unipolar switching elements in a non-linear region is easier than that of bipolar ones.

As described above, in the present embodiment, by operating the switching elements in the non-linear region A2 and using the power loss of the switching elements themselves, a surge voltage generated at the time of turning off the switching elements is suppressed. When the power loss of the switching elements is increased, the temperature of the switching elements rises; however, in the present embodiment, such a suppressing method can be applied because a wide bandgap semiconductor is used, the maximum value of the operation temperature of the switching elements is equal to or higher than 150° C., and thus the operable temperature range is wide.

Meanwhile, when output short-circuit occurs in an inverter circuit, an excessive surge voltage is generated. If a snubber capacitor is prepared to handle the excessive surge voltage, a large-capacity snubber capacitor is required. On the other hand, in the present embodiment, a surge voltage at the time of output short-circuit can be suppressed by performing a surge-voltage suppressing operation at the time of the output short-circuit, while using a small and simple circuit.

In this manner, in the present embodiment, a wide bandgap semiconductor is used for the switching elements, and the drive circuit 5-$i$ causes a gate voltage to change so that the switching elements are operated in the non-linear region A2 at the time of turning off the switching elements. Accordingly, a surge voltage can be suppressed by using a small and simple circuit.

Second Embodiment

Figure 4:
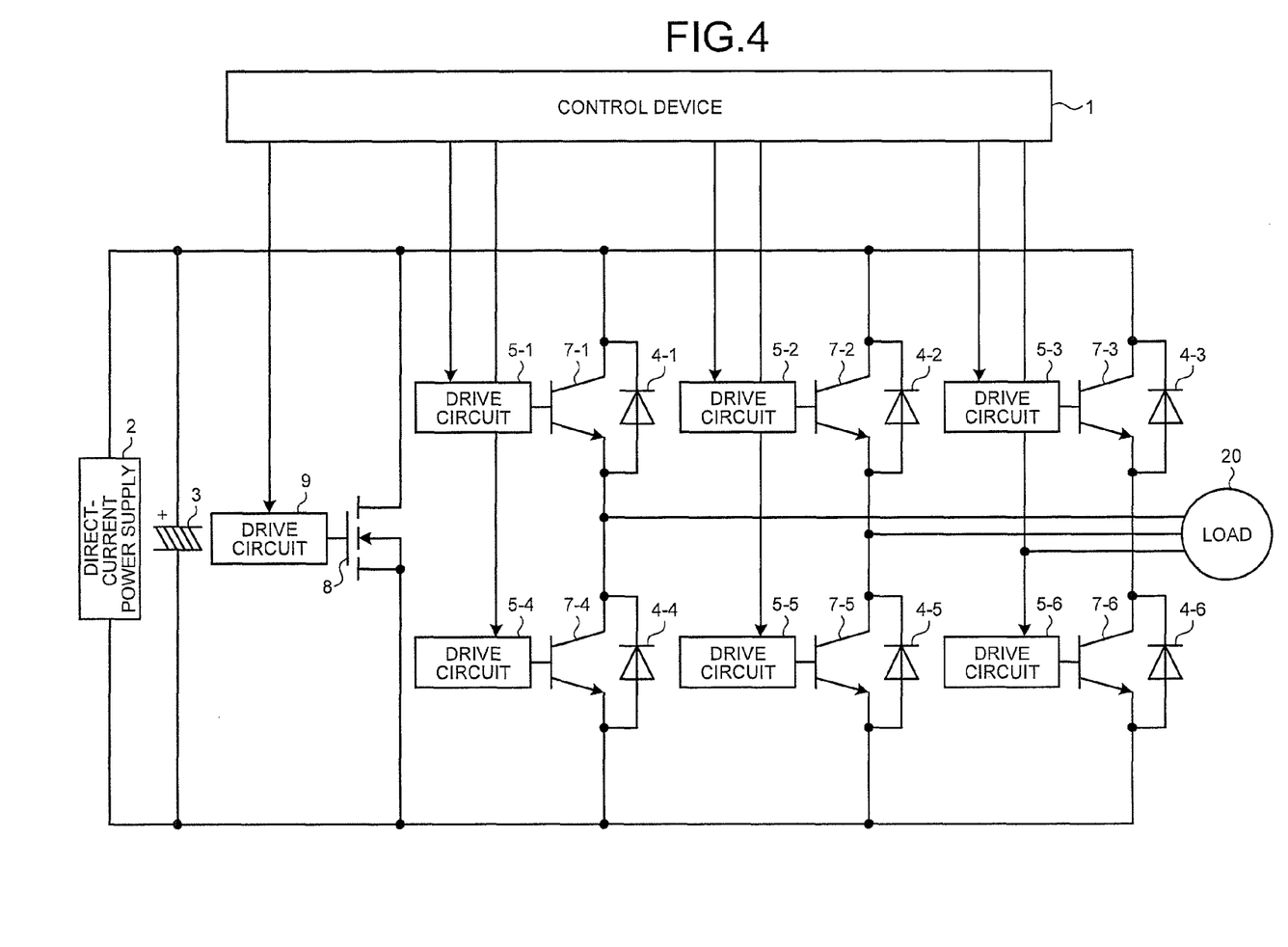
FIG. 4 is a configuration example of an electric power conversion device according to a second embodiment.

FIG. 4 is a configuration example of an electric power conversion device according to a second embodiment of the present invention. The electric power conversion device according to the present embodiment is identical to the electric power conversion device according to the first embodiment, except for adding to the electric power conversion device according to the first embodiment a snubber element 8 serving as a switching element to be used as a snubber circuit instead of a snubber capacitor and a drive circuit 9 that drives the snubber element 8, and for providing a Si semiconductor transistor 7-$i$ instead of the transistor 6-$i$ ($i$=1, 2, . . . 6). Constituent elements having functions identical to those of the first embodiment are denoted by like reference signs as those in the first embodiment, and explanations thereof will be omitted.

In the present embodiment, the snubber element 8 serving as a switching element that uses a wide bandgap semiconductor is arranged in a position where a snubber capacitor is connected if it is a general inverter circuit. Note that, in the present embodiment, while the snubber element 8 is explained as a SiC MOSFET, the present embodiment is not limited thereto and the snubber element 8 can also use other types of wide bandgap semiconductor. Furthermore, in the present embodiment, as the Si semiconductor transistor 7-$i$, a Si IGBT (Insulated Gate Bipolar Transistor) is used. However, the Si semiconductor transistor 7-$i$ is not limited to a Si IGBT, and other types of Si semiconductor can be also used. In the present embodiment, while the snubber element 8 is connected to the transistor 6-$i$ in parallel, the snubber element 8 can be connected to the transistor 6-$i$ in series.

Figure 5:
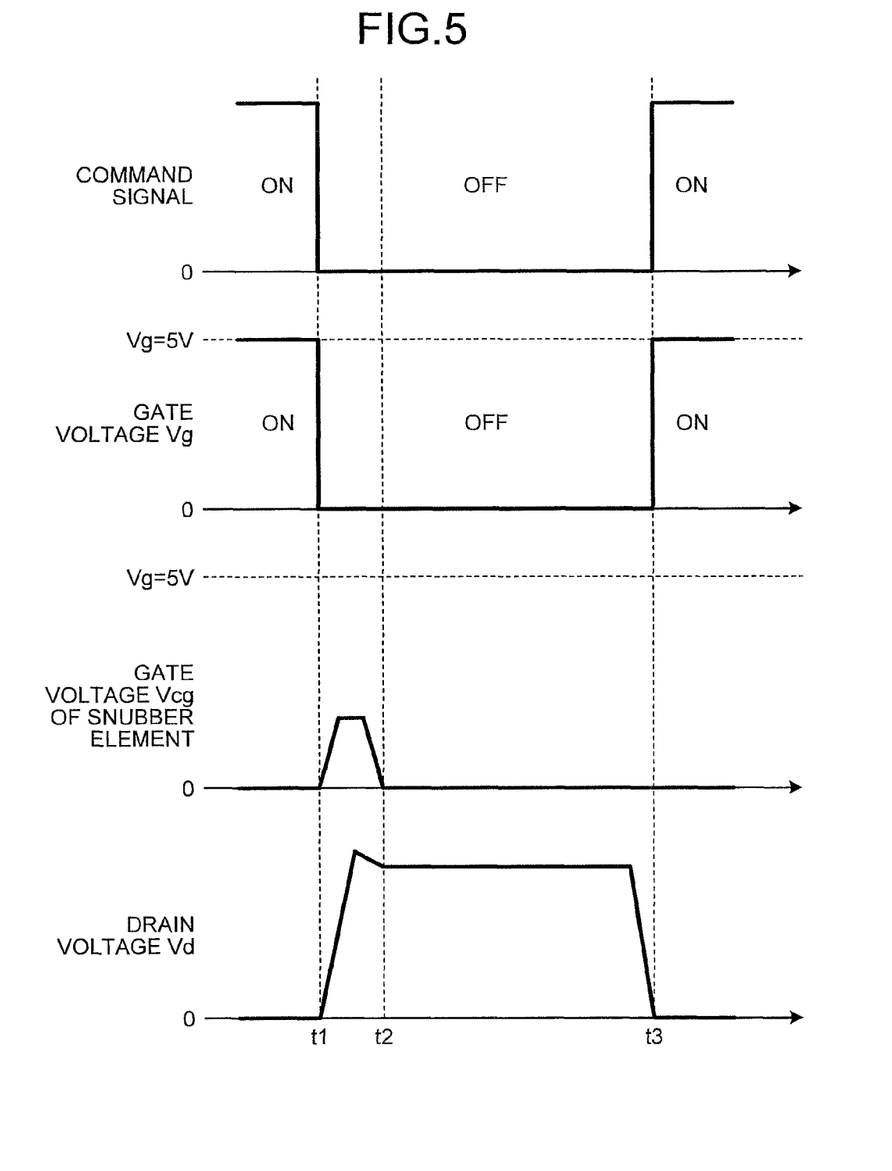
FIG. 5 is a timing chart of an example of a surge voltage suppressing method according to the second embodiment.

FIG. 5 is a timing chart of an example of a surge voltage suppressing method according to the present embodiment. The first tier of FIG. 5 represents a command signal identical to that shown in the top part of FIG. 2. The second tier of FIG. 5 represents the gate voltage Vg applied to the Si semiconductor transistor 7-$i$ by the drive circuit 5-$i$. The third tier of FIG. 5 represents a gate voltage Vcg applied to the snubber element 8 by the drive circuit 9. The fourth tier of FIG. 5 represents the drain/source voltage (drain voltage) Vd of the Si semiconductor transistor 7-$i$.

During a time when an on-state is instructed by a command signal before a time tl, the drive circuit 5-$i$ applies the gate voltage Vg of 5 volts to the Si semiconductor transistor 7-$i$. Meanwhile, during a time when an on-state is instructed by a command signal from the control device 1, the drive circuit 9 sets the gate voltage Vcg of the snubber element 8 as 0 volt. When the command signal changes from ON to OFF at the time tl, similarly to a conventional general electric power conversion device, the drive circuit 5-$i$ sets the gate voltage Vg of the Si semiconductor transistor 7-$i$ as 0 volt.

When the command signal changes from ON to OFF at the time tl, the drive circuit 9 controls the gate voltage Vcg of the snubber element 8 such that the snubber element 8 is operated in a non-linear region, thereby suppressing a surge current generated in Si semiconductor transistors 7-1 to 7-6 by the power loss of the snubber element 8 itself. Specifically, for example, as shown in FIG. 5, the gate voltage Vcg is gradually increased to a predetermined value, the increased voltage is kept for a predetermined time period, and then it is gradually reduced to 0 volt. At this time, it is desirable that the ON time of the gate voltage Vcg (a time when Vcg is not 0 volt) is a time that is substantially equal to a carrier frequency of a switching element (such as approximately 10 to 400 microseconds). Operations of the present embodiment other than those described above are identical to those of the first embodiment.

As described above, in the present embodiment, the snubber element 8 is used instead of a snubber capacitor, the gate voltage Vcg is applied to the snubber element 8 by a predetermined profile at the time of turning off the Si semiconductor transistors 7-1 to 7-6 so that the snubber element 8 is operated in a non-linear region, and a surge voltage generated in the Si semiconductor transistors 7-1 to 7-6 is suppressed by the power loss of the snubber element 8 itself. When the power loss of the snubber element 8 is increased, the temperature of the snubber element 8 rises; however, because a wide bandgap semiconductor is used as the snubber element 8, the maximum value of the operation temperature of the snubber element 8 is equal to or higher than 150° C., and thus the operable temperature range is wide. Therefore, the snubber element 8 can be operated under a high temperature environment. As a result, a surge voltage can be suppressed by using a small and simple circuit.

Third Embodiment

Figure 6:
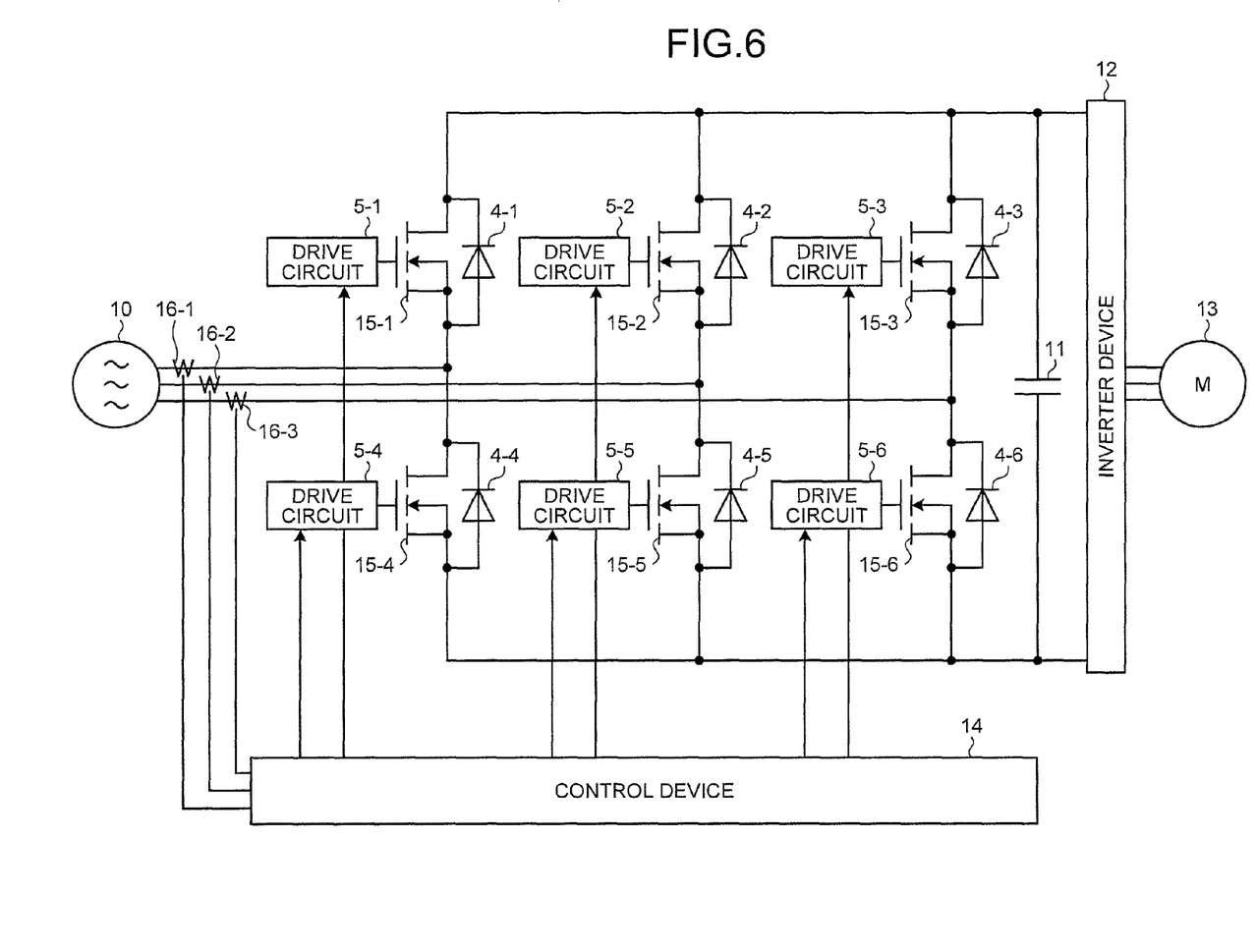
FIG. 6 is a configuration example of an electric power conversion device according to a third embodiment.

FIG. 6 is a configuration example of an electric power conversion device according to a third embodiment of the present invention. The electric power conversion device according to the present embodiment is a power-supply regenerative converter device, and is a device that regenerates an inductive counter-electromotive force (a regenerative energy) generated by a motor 13 (abbreviated as M in FIG. 6) to a three-phase AC power supply 10 via an inverter device 12 that controls speed variations of the motor 13. While the present embodiment exemplifies a case of using the motor 13 as an example of a three-phase load, other types of three-phase load can be also used instead of the motor 13.

A smoothing capacitor in which an induced electromotive force generated when a motor is in a decelerating operation is accumulated is connected between bus bars (not shown) in the inverter device 12. The electric power conversion device according to the present embodiment (a power-supply regenerative converter) is controlled by a control device 14, and is constituted by six switching elements, the drive circuits 5-1 to 5-6 that respectively drive the switching elements, and a snubber capacitor 11. Constituent elements having functions identical to those of the first embodiment are denoted by like reference signs as those in the first embodiment, and explanations thereof will be omitted.

Each of the switching elements is constituted by a regenerative transistor 15-i (i=1, 2, . . ., 6) and the diode 4-i. Similarly to the transistor 6-i according to the first embodiment, a wide bandgap semiconductor is used as the regenerative transistor 15-i, and a Si MOSFET is used in the present embodiment. Note that the regenerative transistor 15-i is not limited to a Si MOSFET, and any type of element can be used therefore as long as it is a switching element using a wide bandgap semiconductor. The diode 4-i is connected to the regenerative transistor 15-i in anti-parallel.

While a film capacitor can be adopted for the snubber capacitor 11 as an example, the snubber capacitor 11 is not limited thereto. The snubber capacitor 11 is connected to regenerative transistors 15-1 to 15-6 in parallel. Respective serial connection ends between the regenerative transistors 15-1 to 15-3 on an upper arm side and the regenerative transistors 15-4 to 15-6 on a lower arm side are regenerative output ends, and these are respectively connected to alternating-current power-supply terminals.

Current detectors 16-1 to 16-3 are respectively arranged on connection lines connecting the three regenerative output ends described above and terminals of the three-phase AC power supply 10, and detect the magnitude and direction of each phase current. When a regenerating operation is performed, the control device 14 specifies an on/off operation timing of the regenerative transistors 15-1 to 15-6, based on a phase relationship among respective phases (an R-phase, an S-phase, and a T-phase) of the three-phase AC power supply 10 detected by a phase detector (not shown). The control device 14 outputs a specified on/off operation timing of the regenerative transistors 15-1 to 15-6 as a command signal for instructing a regenerating operation control to the drive circuits 5-1 to 5-6. The drive circuit 5-i generates a gate signal for operating the regenerative transistor 15-i at a specified timing based on the command signal, and applies the gate signal to a gate terminal of the regenerative transistor 15-i. In the present embodiment, similarly to the transistor 6-i according to the first embodiment, the regenerative transistor 15-i suppresses a surge voltage by using the power loss of the regenerative transistor 15-i itself.

Figure 7:
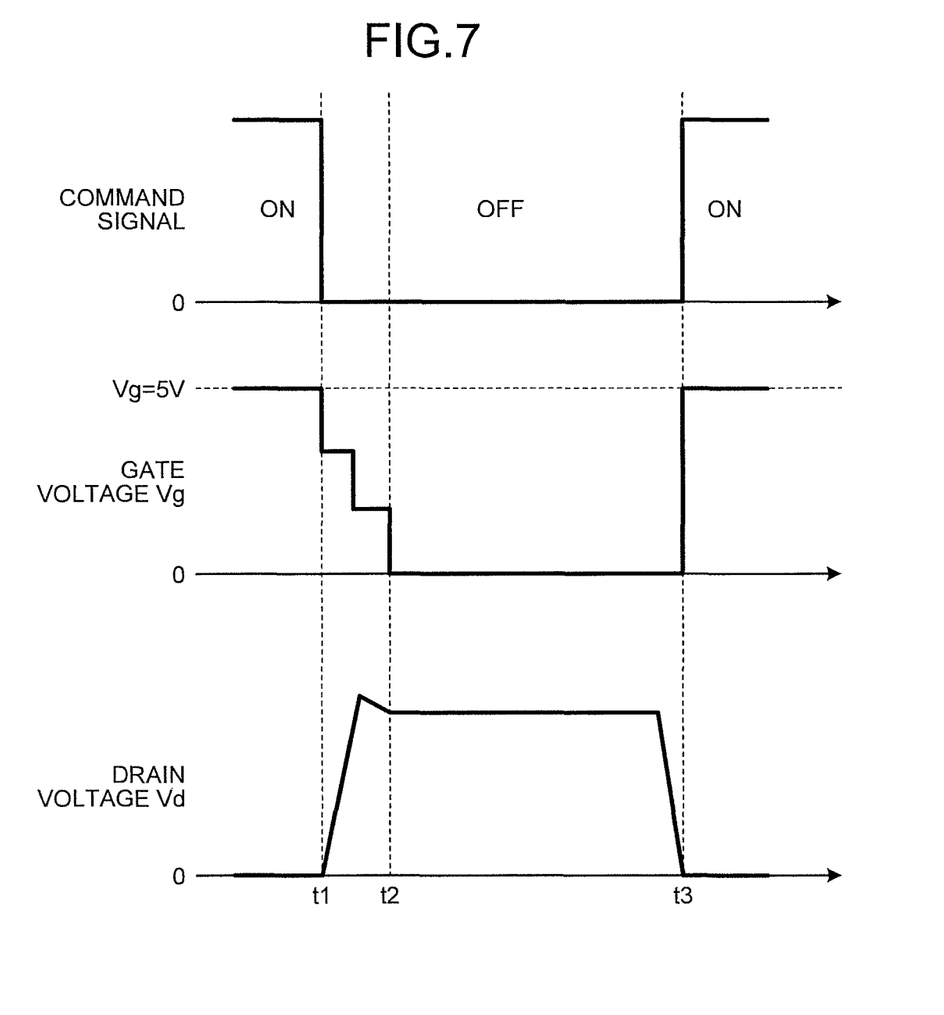
FIG. 7 is a timing chart of an example of a surge voltage suppressing method according to the third embodiment.

FIG. 7 is a timing chart of an example of a surge voltage suppressing method according to the present embodiment. The top part of FIG. 7 represents a command signal output by the control device 14, the middle part of FIG. 7 represents the gate voltage Vg applied to the regenerative transistor 15-i by the drive circuit 5-i, and the bottom part of FIG. 7 represents the drain voltage Vd of the regenerative transistor 15-i.

Similarly to the first embodiment, the drive circuit 5-i sets the gate voltage Vg as 5 volts when the command signal is in an on-state, and when the command signal becomes an off-state, the drive circuit 5-i causes the gate voltage Vg to be gradually dropped. At this time, the profile for dropping the gate voltage Vg is identical to that of the first embodiment, and the gate voltage Vg is dropped so as to cause the regenerative transistor 15-i to change in the non-linear region A2. Similarly to the first embodiment, the gate voltage Vg in an on-state is not limited to 5 volts. Furthermore, similarly to the first embodiment, when the gate voltage is dropped, it is desirable that the gate voltage is dropped from 5 volts to 0 volt within a time that is substantially equal to a carrier frequency of the switching elements (such as approximately 10 to 400 microseconds). Operations of the present embodiment other than those described above are identical to those of the first embodiment.

In this manner, in the present embodiment, in an electric power conversion device that functions as a power-supply regenerative converter, a wide bandgap semiconductor is used for the regenerative transistor 15-i, and the drive circuit 5-i causes a gate voltage to change so that the regenerative transistor 15-i is operated in a non-linear region at the time of turning off the regenerative transistor 15-i. Accordingly, a surge voltage can be suppressed by using a small and simple circuit.

Fourth Embodiment

Figure 8:
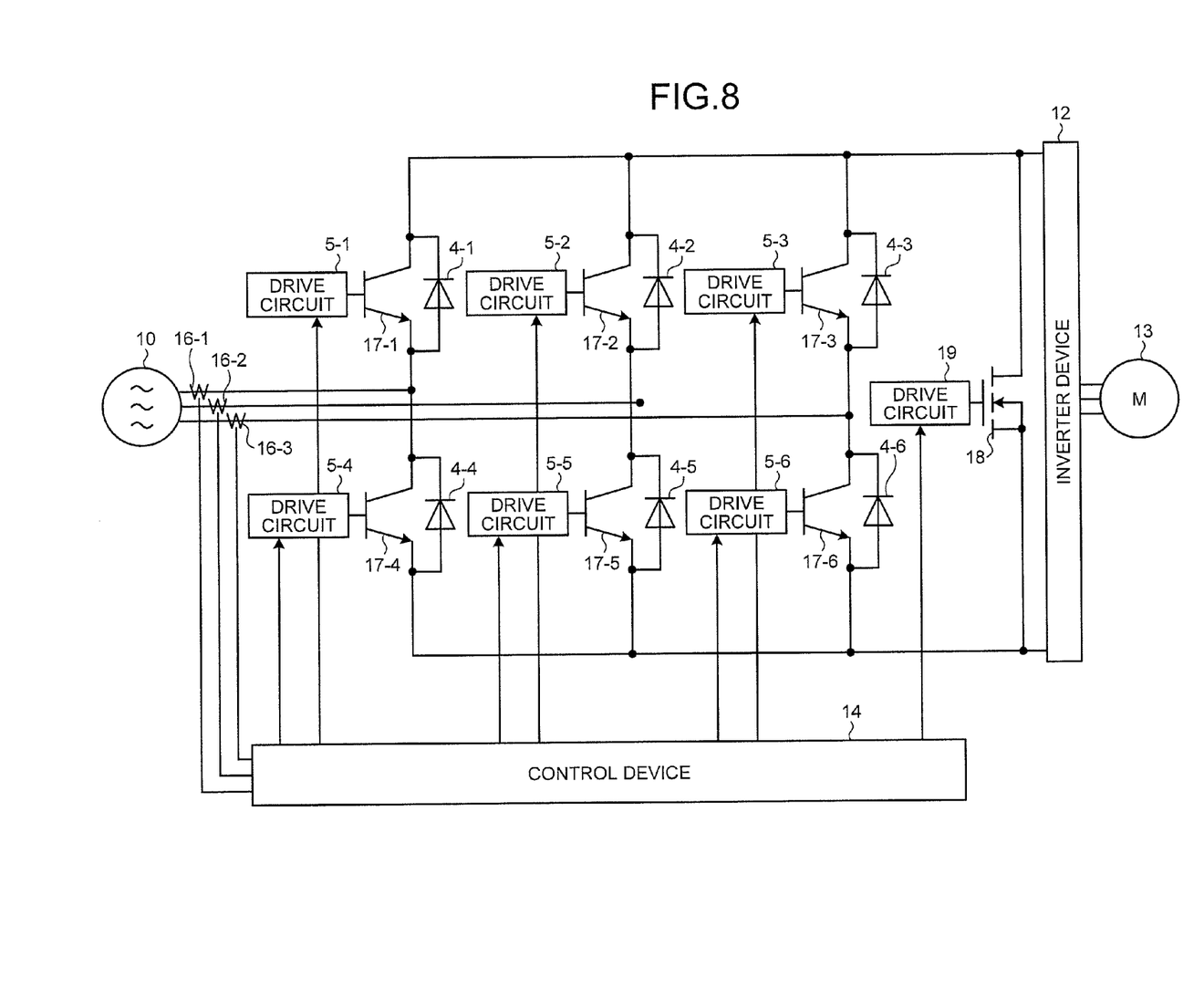
FIG. 8 is a configuration example of an electric power conversion device according to a fourth embodiment.

FIG. 8 is a configuration example of an electric power conversion device according to a fourth embodiment of the present invention. The electric power conversion device according to the present embodiment is identical to the electric power conversion device according to the third embodiment, except for adding to the electric power conversion device according to the third embodiment a snubber element 18 serving as a switching element and arranged instead of a snubber capacitor and a drive circuit 19, and for providing regenerative transistors 17-1 to 17-6 instead of the regenerative transistors 15-1 to 15-6. Constituent elements having functions identical to those of the third embodiment are denoted by like reference signs as those in the third embodiment, and explanations thereof will be omitted.

In the present embodiment, the snubber element 18 serving as a switching element that uses a wide bandgap semiconductor is arranged in a position where a snubber capacitor is connected if it is a conventional general power-supply regenerative converter. Note that, in the present embodiment, while the snubber element 18 is explained as a SiC MOSFET, the present embodiment is not limited thereto and the snubber element 18 can also use any type of wide bandgap semiconductor. Furthermore, in the present embodiment, as the regenerative transistors 17-1 to 17-6, a Si IGBT is used. However, the regenerative transistors 17-1 to 17-6 are not limited to a Si IGBT, and other types of Si semiconductor can be also used. In the present embodiment, similarly to the snubber element 8 according to the second embodiment, the snubber element 18 suppresses a surge voltage in the regenerative transistors 17-1 to 17-6 by the power loss of the snubber element 18 itself.

Figure 9:
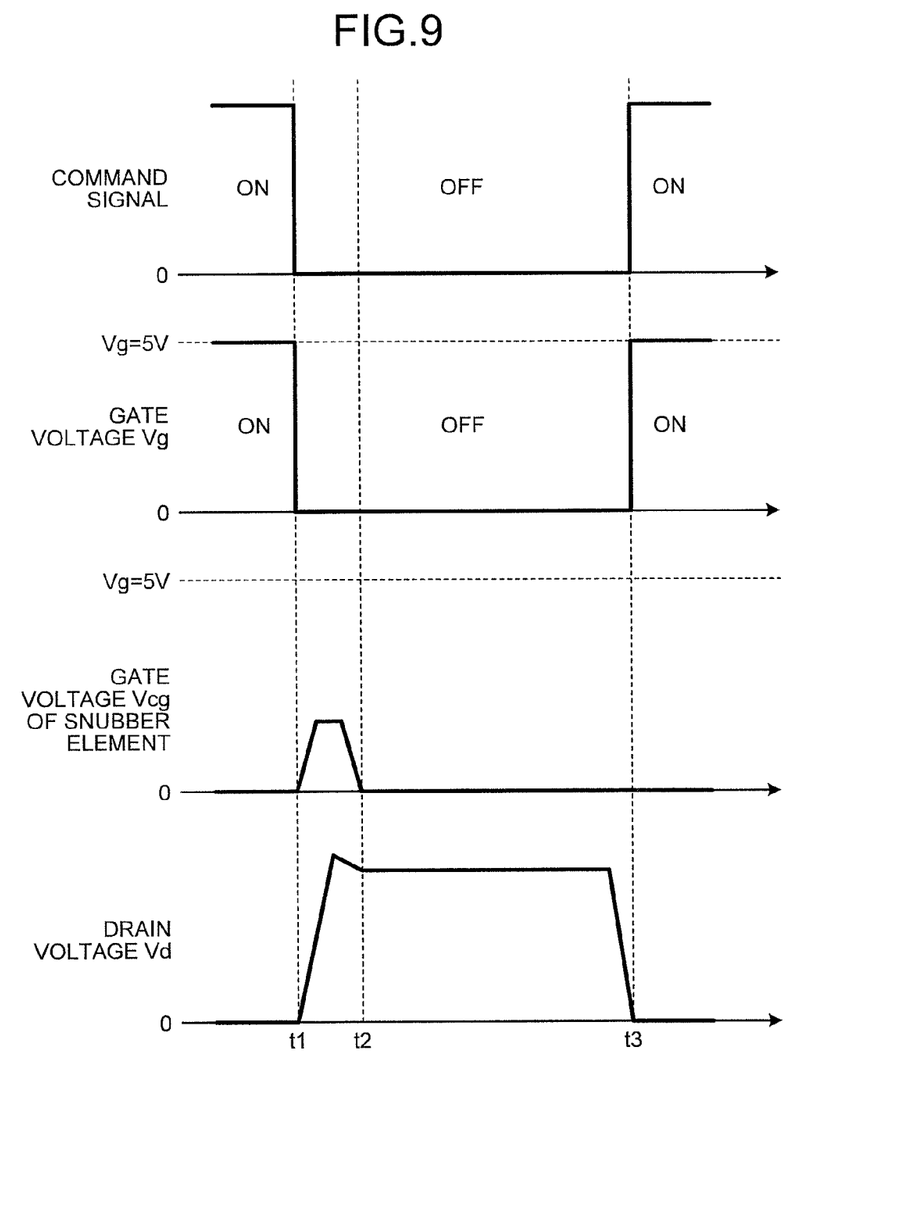
FIG. 9 is a timing chart of an example of a surge voltage suppressing method according to the fourth embodiment.

FIG. 9 is a timing chart of an example of a surge voltage suppressing method according to the present embodiment. The first tier of FIG. 9 represents a command signal output by the control device 14. The second tier of FIG. 9 represents the gate voltage Vg applied to the regenerative transistor 17-$i$ by the drive circuit 5-$i$. The third tier of FIG. 9 represents the gate voltage Vcg applied to the snubber element 18 by the drive circuit 19. The fourth tier of FIG. 9 represents the drain/source voltage (drain voltage) Vd of the regenerative transistor 17-$i$.

Similarly to the second embodiment, in the present embodiment, during a time when an on-state is instructed by a command signal before a time tl, the drive circuit 5-$i$ applies the gate voltage Vg of 5 volts to the regenerative transistor 17-$i$. Meanwhile, during a time when an on-state is instructed by a command signal from the control device 14, the drive circuit 19 sets the gate voltage Vcg of the snubber element 18 as 0 volt. When the command signal changes from ON to OFF at the time tl, similarly to a conventional general electric power conversion device, the drive circuit 5-$i$ sets the gate voltage Vg of the regenerative transistor 17-$i$ as 0 volt.

When the command signal changes from ON to OFF at the time tl, the drive circuit 19 controls the gate voltage Vcg of the snubber element 18 such that the snubber element 18 is operated in a non-linear region, thereby suppressing a surge current generated in the regenerative transistors 17-1 to 17-6 by the power loss of the snubber element 18 itself. Specifically, for example, as shown in FIG. 9, the gate voltage Vcg is gradually increased to a predetermined value, the increased voltage is kept for a predetermined time period, and then it is gradually reduced to 0 volt. At this time, it is desirable that the ON time of the gate voltage Vcg (a time when Vcg is not 0 volt) is a time that is substantially equal to a carrier frequency of the regenerative transistors 17-1 to 17-6 (such as approximately 10 to 400 microseconds). Operations of the present embodiment other than those described above are identical to those of the third embodiment.

In this manner, in the present embodiment, in an electric power conversion device that functions as a power-supply regenerative converter, the snubber element 18 is used instead of a snubber capacitor, the gate voltage Vcg is applied to the snubber element 18 by a predetermined profile at the time of turning off the regenerative transistors 17-1 to 17-6 so that the snubber element 18 is operated in a non-linear region, and a surge voltage generated in the regenerative transistors 17-1 to 17-6 is suppressed by the power loss of the snubber element 18 itself. Accordingly, a surge voltage can be suppressed by using a small and simple circuit.

INDUSTRIAL APPLICABILITY

As described above, the electric power conversion device and the surge voltage suppressing method according to the present invention are useful for an electric power conversion device that converts a direct current into a three-phase alternating current, an inverter circuit such as a motor, and an electric power conversion device that regenerates an inductive counter-electromotive force due to a three-phase load to a three-phase AC power supply, and are particularly suitable for an electric power conversion device that is supposed to have a small and simple circuit incorporated therein.

REFERENCE SIGNS LIST

1, 14 control device
2 direct-current power supply
3 smoothing capacitor
4-1 to 4-6 diode
5-1 to 5-6, 9, 19 drive circuit
6-1 to 6-6 transistor
7-1 to 7-6 Si semiconductor transistor
8, 18 snubber element
10 three-phase AC power supply
11 snubber capacitor
12 inverter device
13 motor (M)
15-1 to 15-6, 17-1 to 17-6 regenerative transistor
16-1 to 16-3 current detector
20 load

The invention claimed is:

1. An electric power conversion device comprising:
   a voltage-driven wide bandgap switching element that uses a wide bandgap semiconductor; and
   a drive circuit that preliminarily specifies a characteristic of a drain current for a drain voltage of the wide bandgap switching element, sets an area where a change of the drain current for the drain voltage becomes non-linear in the characteristic as a non-linear region. and controls a voltage for driving the wide bandgap switching element at a time of turning off the wide bandgap switching element based on a voltage profile being specified such that the wide bandgap switching element is operated in the non-linear region.

2. The electric power conversion device according to claim 1, wherein
   the electric power conversion device is an inverter device that converts direct current power supplied from a direct-current power supply into alternating current power, and
   the wide bandgap switching element is a switching element that converts direct current power into alternating current power by an on/off operation of the switching element itself.

3. The electric power conversion device according to claim 1, wherein
   the electric power conversion device is a regenerative converter device that regenerates a regenerative energy supplied from a load to an alternating-current power supply, and
   the wide bandgap switching element is a switching element that regenerates a regenerative energy to an alternating-current power supply by an on/off operation of the switching element itself.

4. The electric power conversion device according to claim 1, wherein
   the electric power conversion device is an inverter device that converts direct current power supplied from a direct-current power supply into alternating current power,
   the wide bandgap switching element converts direct current power into alternating current power as a protection-target switching element, and the electric power conversion device further comprises a
snubber circuit that protects the wide bandgap switching
element from an overcurrent.

5. The electric power conversion device according to claim 1, wherein
the electric power conversion device is a regenerative converter device that regenerates a regenerative energy supplied from a load to an alternating-current power supply,
the wide bandgap switching element, regenerates a regenerative energy to an alternating-current power supply as a protection-target switching element, and
the electric power conversion device further comprises a snubber circuit that protects the wide bandgap switching element from an overcurrent.

6. The electric power conversion device according to claim 4, wherein
the snubber circuit is connected to the wide bandgap switching element in parallel.

7. The electric power conversion device according to claim 1, wherein the wide bandgap switching element is of a unipolar type.

8. The electric power conversion device according to claim 1, wherein the time of turning off includes a time of turning off due to output short-circuit.

9. The electric power conversion device according to claim 1, wherein the wide bandgap semiconductor is made of silicon carbide.

10. A surge voltage suppressing method in an electric power conversion device having a voltage driven type wide bandgap switching element using a wide bandgap semiconductor, the method including:
a voltage determining step of preliminarily specifying a characteristic a drain current for a drain voltage of the wide bandgap switching element, setting an area where a change of the drain current for the drain voltage becomes non-linear in the characteristic as a non-linear region and determining a voltage profile for driving the wide bandgap switching element at a time of turning off the wide bandgap switching element to have the wide bandgap switching element operate in the non-linear region at a time of driving the wide bandgap switching element based on the voltage profile; and
a driving step of controlling a voltage for driving the wide bandgap switching element based on the voltage profile at the time of turning off the wide bandgap switching of element.

11. The electric power conversion device according to claim 5, wherein
the wide bandgap switching element functions as a protection-target switching element and is connected to a snubber circuit in parallel.

12. The electric power conversion device according to claim 1, wherein the voltage profile is obtained in advance by a test or an analysis.

* * * * *